United States Patent [19]
Wilbourn

[11] 3,838,315
[45] Sept. 24, 1974

[54] UNIVERSAL BRIDGE COMPLETION CIRCUIT FOR SELECTIVELY CONNECTING RESISTORS FOR INCLUSION IN A BRIDGE CIRCUIT

[75] Inventor: James B. Wilbourn, Huntsville, Ala.

[73] Assignee: Avco Corporation, Huntsville, Ala.

[22] Filed: Oct. 1, 1973

[21] Appl. No.: 402,070

[52] U.S. Cl. .............. 317/99, 317/101 P, 339/17 M, 339/32 M

[51] Int. Cl. .............. H02b 1/04, H05k 1/14

[58] Field of Search ........... 339/32, 33, 17 M, 17 N; 317/99, 101 P, 101 CM, 101 CW, 101 CE, 118; 174/DIG. 3; 323/75 N; 35/19 A

[56] References Cited

UNITED STATES PATENTS

| | | | |
|---|---|---|---|
| 3,193,731 | 7/1965 | Gerlach | 317/101 CW |
| 3,210,745 | 10/1965 | Dadamo | 317/101 D |
| 3,231,767 | 1/1966 | Powell | 339/32 M |
| 3,299,403 | 1/1967 | Young | 317/101 P |

*Primary Examiner*—Robert K. Schaefer
*Assistant Examiner*—Gerald P. Tolin
*Attorney, Agent, or Firm*—Charles M. Hogan; Irwin P. Garfinkle

[57] ABSTRACT

A mechanism is provided in which an impedance bridge circuit may be completed by using any of three combinations of bridge impedances in combination with external resistive devices. The mechanism comprises two circuit boards having complementary connectors symmetrically positioned so that the orientation of the boards can be rotated. The mechanism, in combination with external resistive devices, allows the formation of a complete four-arm impedance bridge by rotating the circuit boards 90, 180 or 270°.

11 Claims, 9 Drawing Figures

PATENTED SEP 24 1974 3,838,315

SHEET 3 OF 4

UNIVERSAL BRIDGE COMPLETION CIRCUIT FOR SELECTIVELY CONNECTING RESISTORS FOR INCLUSION IN A BRIDGE CIRCUIT

BACKGROUND OF THE INVENTION

The conventional impedance bridge comprises four impedances connected in a closed series loop with a source of excitation potential being connected across two diagonals of the bridge while an output circuit is connected between the other diagonals. If all of the impedances are equal, the output voltage is zero. If the impedances are unequal, a voltage appears across the output.

Where an impedance bridge is used in a sensing circuit, one or more of the impedances is variable with a particular condition to be sensed, for example, temperature, pressure or strain. Depending on the particular conditions to be measured, the bridge may require as many as four variable impedance arms.

The present invention provides a simple, universal mechansim which includes three fixed impedances. The universal mechanism permits the following connections: (1)a single variable impedance connected in a series loop with the three fixed impedances in the universal mechanism; (2) two variable impedances connected in a series loop with two of the fixed impedances of the universal mechanism; or (3) the connection of four variable impedance elements without using any of the fixed impedances of the universal mechanism. The foregoing is accomplished by rotating a plug-in printed circuit board on which the fixed impedances are mounted, 90, 180 or 270° with respect to the complementary circuit board onto which a circuit having the required number of variable elements is plugged.

THE DRAWINGS

DESCRIPTION OF THE INVENTION

Figure 1:
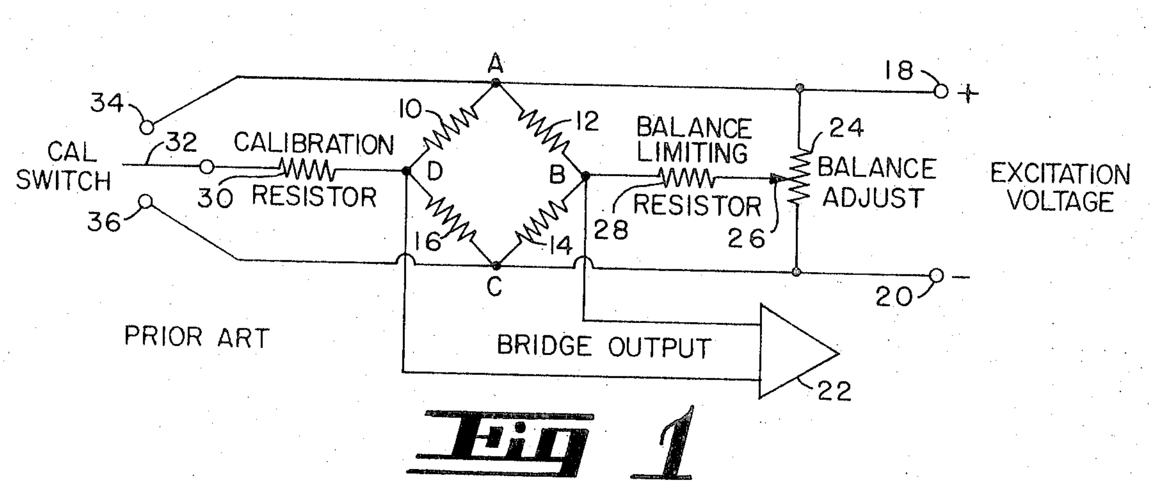
FIG. 1 is a conventional bridge circuit.

FIG. 1 illustrates a conventional bridge configuration in which four impedances 10, 12, 14 and 16 are connected in a closed series loop. The terminals 18 and 20 of an excitation voltage source are connected across the diagonally opposite junctions A and C of the bridge while an output circuit 22 is connected across the other diagonally opposite junctions B and D. A balance adjustment resistor 24 is connected between the terminals 18 and 20 while the junction B is connected to the variable tap 26 of resistor 24 through a balance limiting resistor 28. A calibration resistor 30 connected between a switch 32 and the junction D is selectively connectable across the resistors 10 or 16 depending upon the position of the switch 32 with respect to the switch contact poles 34 and 36. Resistor 30 has a known value and is used to calibrate the bridge output circuit 22.

When all four bridge resistors 10, 12, 14 and 16 are the same value, and with the excitation voltage applied across junction A and C, the differential voltage across junctions B and D should be zero. If there is an error voltage due to slight differences in the values of the bridge resistors, the variable tap 26 on the resistor 24 is adjustable to obtain a zero voltage across junctions B and D. The balance limiting resistor 28 determines the sensitivity of the adjustment. When the resistance of any of the bridge resistors changes, a voltage is developed in the bridge output circuit 22.

The invention incorporates the conventional bridge configuration shown in FIG. 1 into a universal arrangement which may be selectively altered to provide variable impedances in one or more of the legs of the bridge. The invention includes the use of a mother board 38 to which a printed circuit board 40 may be plugged in various orientations. In addition the invention utilizes one of several external circuits hereinafter to be described.

Figure 2:
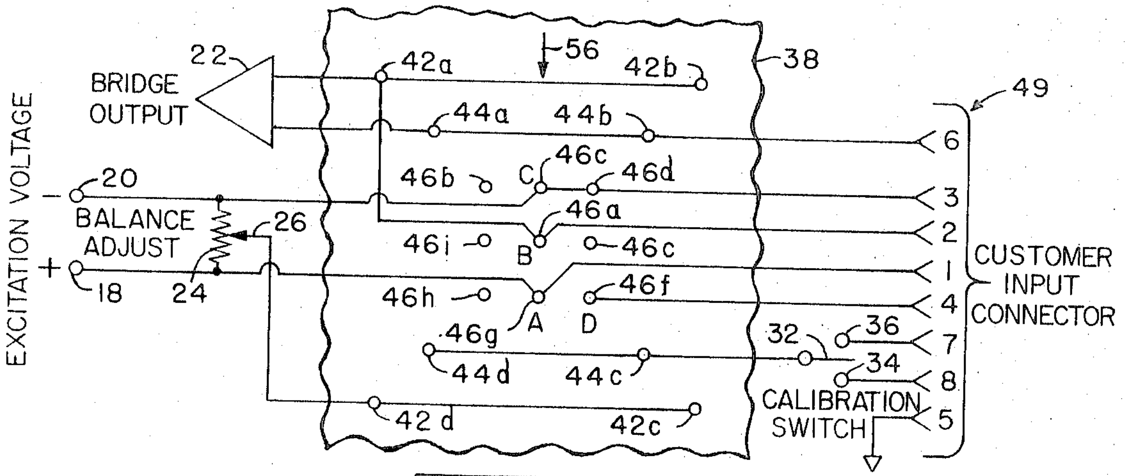
FIG. 2 shows the layout of the "mother board" used in accordance with this invention.

The mother board is illustrated in FIG. 2 and it includes three groups of symmetrically arranged pin sockets. One group includes four pin sockets *42a–42d* spaced 90° apart in a square configuration. A second group has four pin sockets *44a–44d* similarly spaced 90° apart in a somewhat smaller square configuration. The third group has nine pin sockets *46a–46i*. The pin socket *46a* is centrally located, while the remaining eight pin sockets *46b–46i* are spaced 45° apart in a square configuration surrounding the central pin socket. For convenience, the pin sockets *46g, 46a, 46c* and *46f* are labeled as junctions A, B, C and D, respectively. While the disclosed embodiment shows the pin sockets disposed in squares, it will be understood that any symmetrical pattern may be used, and a circular configuration is also contemplated by this invention. The essential factor is that the sockets are symmetrically disposed at appropriate angles, in this case at 90° and 45° angles, respectively.

One terminal of the bridge output circuit 22 is connected to the pin sockets *42a* and *42b* and to the central pin socket *46a*. The central pin socket *46a* is connected to the terminal 2 of the female half of an input connector 49 associated with the external circuit hereinafter to be described. The other terminal of the bridge output circuit 22 is connected to the pin sockets *44a* and *44b*. These sockets are in turn connected to the terminal 6 of the input connector 49. The excitation voltage terminal 18 is connected to the pin socket *46g* which in turn is connected to the terminal 1 of the input connector 49. The terminal 20 of the excitation voltage is connected to the pin sockets *46c* and *46d* which in turn are connected to the terminal 3 of the input connector. The pin sockets *44c* and *44d* are interconnected and in turn are both connected to the contact arm 48 of a single pole double throw switch 50. The pole 36 of switch 32 is connected to terminal 7 of the input connector while the pole 34 is connected to terminal 8. The balance adjust resistor 24 is connected between the terminals 18 and 20 while its movable tap 26 is connected to the pin sockets *42d* and *42c*. Pin socket *46f* is connected to pin 4 of input connector 49.

Pin 5 of input connector 49 is used as a shield connection for the input cable.

The printed circuit board 40 has an identical number of pins laid out in precisely the same position as the pin sockets 42, 44 and 46. The pins 43*a*–43*d* are complementary to the pin sockets 42*a*–42*d;* and the pins 45*a*–45*d* are complementary to the pin sockets 44*a* –44*d;* and the pins 47*a*–47*i* are complentantary to the pin sockets 46*a*–46*i.* Because the pin socket 46*a* and the pin 47*a* are centrally located, and since all the other pins and sockets are symmetrically located, the printed circuit board 40 may be oriented in any one of four positions with respect to the mother board 38. That is to say, the pins of the printed circuit board 40 may be plugged into the pin sockets of the mother board 38 with the edge marked "single active arm" adjacent the arrow 56 or the board 40 may be oriented at 90°, 180° or 270° from that position.

As noted in connection with FIG. 1, the conventional bridge circuit requires four impedances. In some applications three of these impedances are fixed while the fourth is variable as a function of the condition being monitored or measured. In other cases two of the impedances may be fixed while two variable impedances are used. In still other cases none of the impedances may be fixed but all may be variable in accordance with the particular functions. The universal bridge constructed in accordance with this invention uses three fixed bridge resistors 60, 62 and 64 which are permanently mounted on the printed circuit board 40. Depending on the orientation of the printed circuit board 40 with respect to the mother board 38, only certain ones or combinations of these resistors are connected in the bridge circuit as required to build a complete bridge from the variable sensors.

Figure 3:
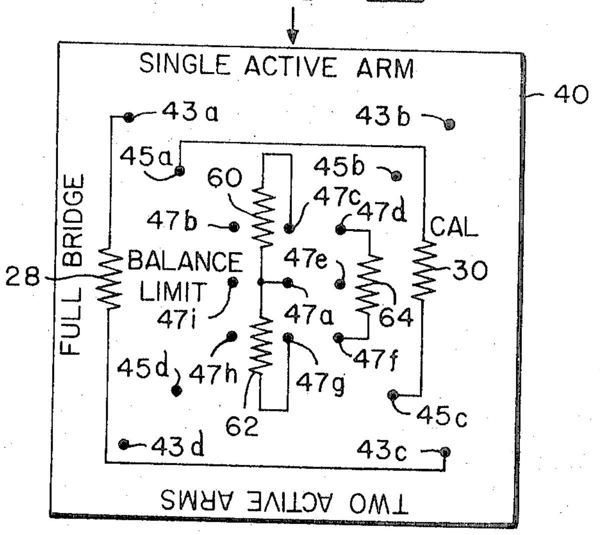
FIG. 3 shows the layout of a complementary printed circuit board used in accordance with this invention.

As seen in FIG. 3, the printed circuit board 40 carries five resistors. The bridge resistors comprise the resistor 60 connected between the pins 47*a* and 47*c*, the resistor 62 connected between the pins 47*a* and 47*g*, and the resistor 64 connected between the pins 47*d* and 47*f*. The balance limiting resistor 28 is connected between the pins 43*a* and 43*c* and the calibration resistor 30 is connected between the pins 45*a* and 45*c*.

Figure 4:
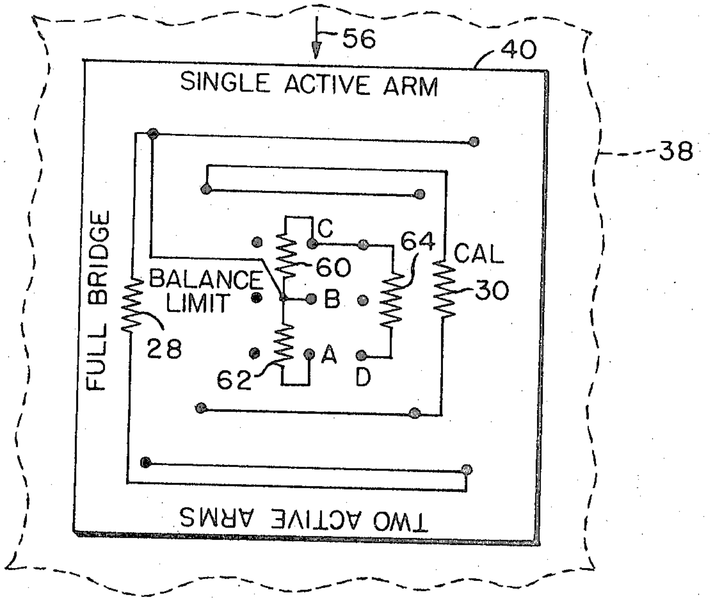
FIG. 4 is a composite drawing of the mother board and the complementary board oriented for connection of a single active arm.
Figure 5:
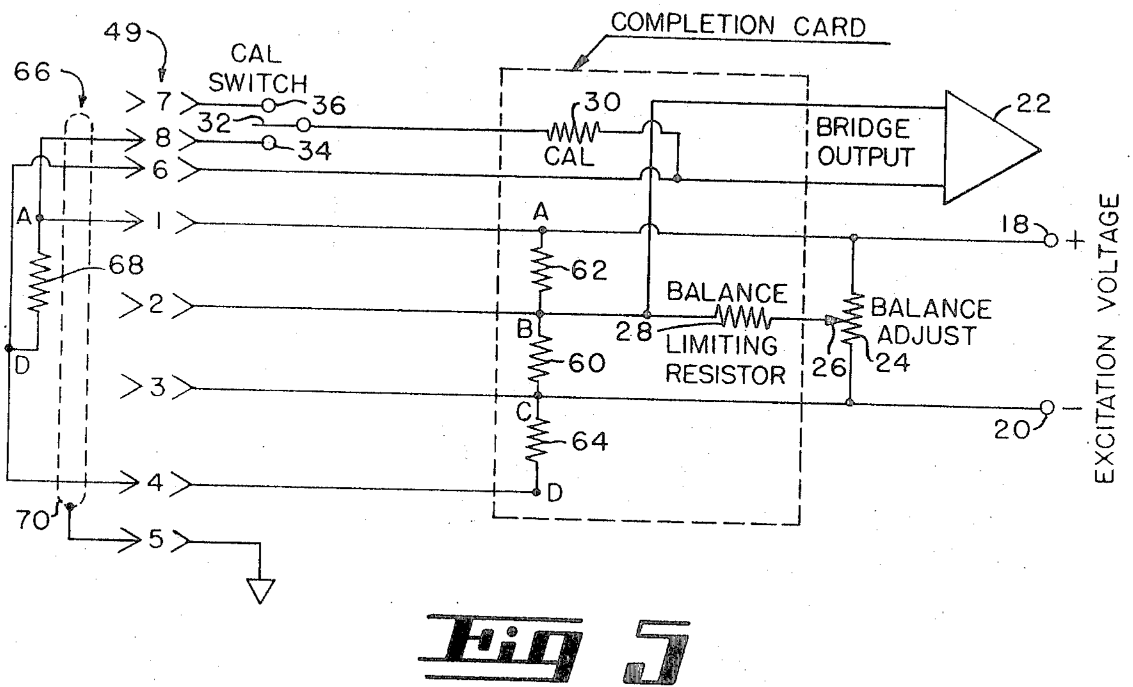
FIG. 5 is a schematic showing of FIG. 4 and includes the external device.

FIG. 4 is a composite of the connections when the printed circuit board 40 is connected to the mother board 38 wwth the arrow 56 adjacent the "single active arm." It will be noted that in this position the three resistors 60, 62 and 64 are connected in a series with the loop open between the junctions A and D. The loop is closed by means of the external circuit 66 as shown in FIG. 5 to which reference is now made.

The external circuit 66 consists of a resistor 68. One end of the resistor 68 is connected to the terminals 1 and 8 of the male half of the connector 49 while the other end is connected between the terminals 4 and 6. The connector shield 70 is connected to the terminal 5. With the circuit board 40 oriented with respect to the mother board 38 as shown in FIG. 4, and with the completion circuit 66 connected as shown in FIG. 5, the bridge circuit includes the resistors 60, 62, 64, and 68 in a closed loop with the bridge output circuit 22 connected between the junctions B and D while the terminals 18 and 20 of the excitation voltage source are connected across the junctions A and C. The balance adjust resistor 24 is connected on the mother board between the terminals 18 and 20 and the one end of the balance limiting resistor 28. The other end of resistor 28 is connected to the junction B. The connection of the calibration resistor 30 in parallel with the resistor 68 is established through the terminal 8 of the connector 49.

Figure 6:
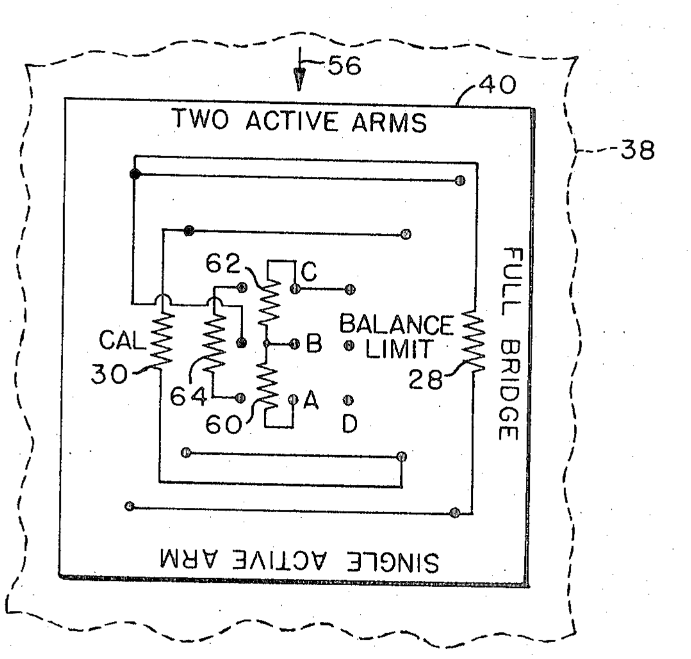
FIG. 6 is a composite with the boards oriented for connection of two active arms.
Figure 7:
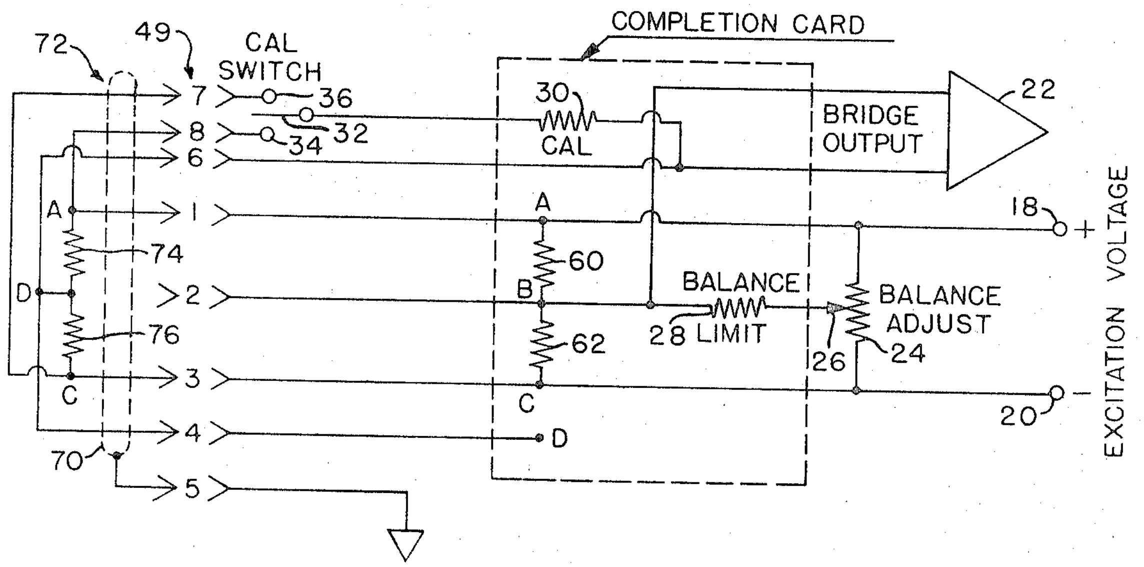
FIG. 7 is a schematic of FIG. 6 and includes the two external devices.

When the circuit board 40 is rotated 180° from the position shown in FIG. 6, then the resistor 64 is disconnected and an external circuit 72 as shown in FIG. 7 may be used as a complete bridge. The external circuit 72 comprises two series-connected resistors 74 and 76. The junction D of resistors 74 and 76 is connected to the terminals 4 and 6 of the male half of connector 49. The junction C of resistor 76 is connected to the terminals 3 and 7 while the junction A of resistor 74 is connected to the terminals 1 and 8. The shield 70 is connected to the terminal 5.

With the orientation shown in FIG. 6 and with the external circuit 72, the bridge circuit comprises a closed loop consisting of the resistors 60, 62, 74 and 76. With this arrangement the bridge output circuit 22 is connected between the junctions B and D while the terminals 18 and 20 of the excitation voltage source are connected between the junctions A and C. The calibration resistor 30 is selectably connectable across either the resistor 74 or 76 by connecting the switch 32 to either the pole 34 or 36 via the respective connector terminals 8 and 7. The balance adjust resistor 34 is connected between the terminals 18 and 20 of the excitation voltage source and through the balance limit resistor 28 to the junction B.

Figure 8:
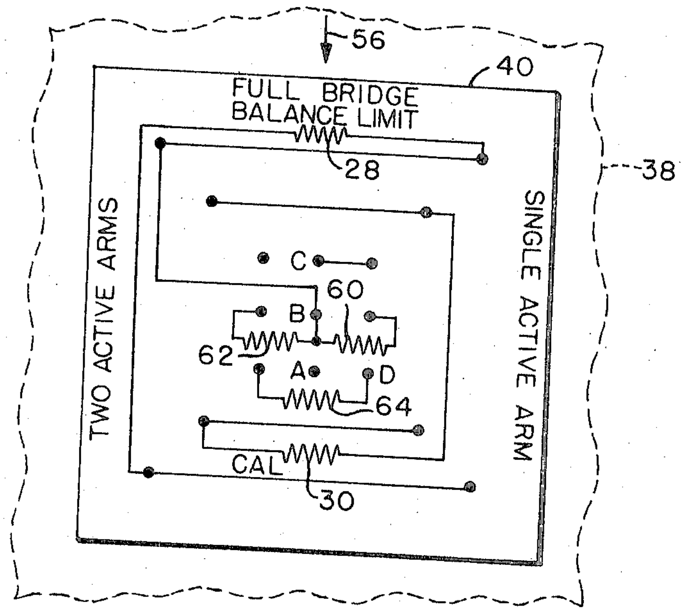
FIG. 8 is a composite with the boards oriented for connection of four active arms.
Figure 9:
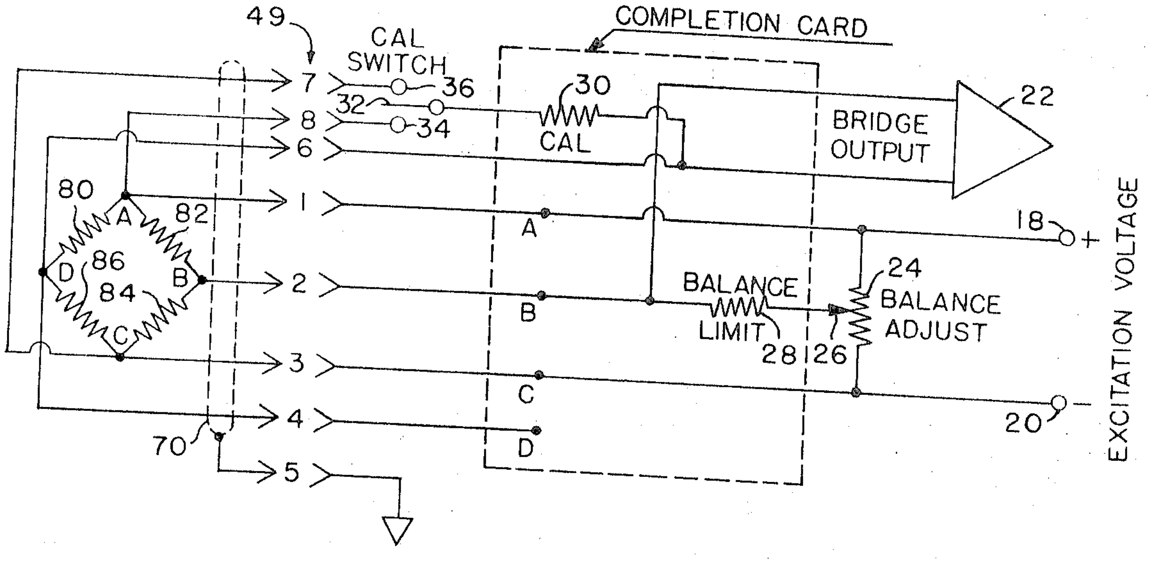
FIG. 9 is a schematic of FIG. 8 and includes the four external devices.

FIG. 8 shows the printed circuit board 40 rotated 270° from the position shown in FIG. 4. In this position none of the resistors 60, 62, or 64 is connected into the bridge circuit, and therefore allows use of the external circuit 78, illustrated in FIG. 9, consisting of four resistors 80, 82, 84, and 86 connected in a closed loop. The junction A is connected to the terminals 1 and 8 of the male half of connectors 49; the junction B is connected to the terminal 2; the junction C is connected to the terminals 3 and 7; the junction D is connected to the terminals 4 and 6; and the shield 70 is connected to the terminal 5. With this arrangement the bridge output circuit 22 is connected between the junctions B and D while the terminals 18 and 20 of the excitation voltage source are connected between the terminals A and C. The balance adjust resistor 24 is connected between the terminals 18 and 20 and through the balance limit resistor 28 to the junction B via the connector terminals 2. The calibration resistor 20 is selectively connectable by means of switch 32 to either of the poles 34 or 36 so that a connection across either the resistor 80 or the resistor 86 is completed through the terminals 8 or 7, respectively.

The connectors on the mother board 38 and on the printed circuit board 40 are arranged so that in the 0° position the three resistors 60, 62, and 64 are connected in a series loop by means of the interconnection of the pins 46*c* and d on the mother board. When the printed circuit board 40 is rotated at 180°, no such interconnection is made and therefore only the resistors 60 and 62 are connected in the circuit. When rotated 90° or 270°, all three bridge resistors 60, 62, 64 are disconnected from the circuit.

In essence, of the nine pins 47*a–i*, only pins 47*a, c, d, f,* and *g* are actually required for completing circuits in conjunction with the corresponding sockets 46*a, c, d, f,* and *g*. The pins 47*b, e, h,* and *i* are dummy pins which serve to enable a mechanical connection in each orientation position. The connections for the balance limiting resistor 28 and the calibration resistor 30 are such that these resistors are always in the circuit irrespective of the relative orientation of the mother board and the printed circuit board.

From the foregoing it will be recognized that a substitution may be made for the fixed resistors 60, 62, and 64 by rotating the printed circuit board 40 so as to disconnect certain ones of them from the bridge circuit and then recompleting the bridge circuit with resistors contained in an external circuit. In actual practice the resistors in the external circuit will be sensors used for determining changes in strain, temperature, pressure, velocity, and other similar parameters. The sensor may be any type of variable impedance device in which the impedance changes predictably with the change in the parameter being measured.

The invention has particular application in those circumstances where the bridge circuits are being mass produced for consumer use but where each consumer may have special requirements for the use of different numbers of variable sensors.

While the disclosed embodiment of this invention represents apparatus which has been reduced to practice, it will be apparent that various modifications will be available to persons skilled in the art. For example certain of the components along with their functions can be eliminated or additional components can be added to provide additional functions. In addition a rotation of the circuit board to angles other than 90°, 180° or 270° may be used to accomplish the same results, particularly if the layout of the pins and pin sockets is circular.

What is claimed is:

1. A universal mechanism for use in constructing an impedance bridge circuit comprised of four impedances connected in a series loop, the terminals of a source of excitation voltage being connected between one pair of diagonally opposite junctions of said loop, and the terminals of an output circuit being connected across the other pair of diagonally opposite junctions, the combination comprising:

a first circuit board;

a second circuit board;

a plurality of separable mating male and female connectors, said male connectors being fixedly mounted on one of said circuit boards, said female connectors being fixedly mounted on the other of said circuit boards, said connectors being located in a complementary symmetrical pattern so that said male and female connectors are complementary whether relatively oriented in a first complementary position as well as when relatively oriented 90°, 180° and 270° with respect to said first complementary position;

connections from the first and second terminals of said source to first and second connectors on said first circuit board;

a connection from one terminal of said output circuit to a third one of said connectors on said first circuit board;

fourth and fifth connectors on said first board, said fourth connector being electrically connected to said first connector;

first, second, third, fourth, and fifth complementary connectors on said second circuit board;

first, second and third impedances on said second circuit board, each impedance being connected, respectively, between said first and third, third and second, and fourth and fifth connectors on said second board, all of said first, second and third impedances being connected in series as a portion of said bridge circuit when said second board is oriented in said first complementary position, said first and second impedances being connected as a portion of said bridge circuit when said second board is oriented 180° with respect to said first complementary position, none of said impedances being connected as a portion of said bridge circuit when said second board is oriented 90° or 270° with respect to said first position.

2. The invention as defined in claim 1 wherein one of each said male and female connectors is centrally positioned with respect to the remainder of said connectors whereby the central male connector always mates with the central female connector irrespective of the orientation of said board.

3. The invention as defined in claim 2 wherein said third connector on said first board is the central connector, and wherein said first, second, and third connectors are in a straight line, and wherein the remainder of said connectors on said one board are disposed at angles of 45° or with respect to said line; and wherein said first, second, third, fourth, and fifth connectors on said other board are complementary to said first, second, third, fourth, and fifth connectors on said first board when said boards are oriented in said first position.

4. The invention as defined in claim 3, and four dummy male and female connectors on respective boards.

5. The invention as defined in claim 4 wherein all of the nine connectors are disposed in columns and rows of three.

6. The invention as defined in claim 1, an additional circuit means connectable to selected connectors on said one board for completing said bridge circuit.

7. The invention as defined in claim 5 wherein said additional circuit means includes a separable connection to the other terminal of said output circuit, and an additional impedance for connection in said bridge circuit.

8. The invention as defined in claim 1, and a first set of first, second, third, and fourth separable mating male and female connectors, said male connectors being fixedly mounted on one of said circuit boards, said female connectors being fixedly mounted on the other of said circuit boards, said connectors being located in a complementary symmetrical pattern so that said male and female connectors are complementary whether oriented in a first complementary position as well as when oriented 90°, 180°, and 270° with respect to said first complementary position;

connectors from the first terminals of said output circuit to said first and second connectors on one of said boards, said third and fourth connectors on said one board being interconnected; and a balance limiting resistor connected between the first and third terminals on the other of said boards.

9. The invention as defined in claim 8, and additional circuit means connectable to selected connectors on said one board for completing said bridge circuit and for completing the connections of said balance limiting resistor.

10. The invention as defined in claim 9 wherein said additional circuit means includes a separable connection to the other terminal of said output circuit, and an additional impedance for connection in said bridge circuit.

11. The invention as defined in claim 10, and a second set of fifth, sixth, seventh, and eighth separable mating male and female connectors, said male connectors being fixedly mounted on one of said circuit boards, said female connectors being fixedly mounted on the other of said circuit boards, said connectors being located in a complementary symmetrical pattern so that said male and female connectors are complementary whether oriented in a fixed complementary position as well as when oriented 90°, 180°, and 270° with respect to said first complementary position;

connections from the other terminal of said output circuit to said fifth and sixth connectors on said one circuit board;

a single pole double throw switch;

connections from said switch to said seventh and eighth connectors on one of said circuit boards; and a calibration resistor connected between said fifth and seventh connectors on said other circuit board.

* * * * *

PO-1050
(5/69)

UNITED STATES PATENT OFFICE
CERTIFICATE OF CORRECTION

Patent No. 3,838,315 Dated September 24, 1974

Inventor(s) James B. Wilbourn

It is certified that error appears in the above-identified patent and that said Letters Patent are hereby corrected as shown below:

Col. 2, line 8, "junction" should read "junctions".

Col. 3, line 46, "wwth" should read "with".

Col. 4, line 26, "resistor 34" should read "resistor 24".

Col. 6, line 58 (Claim 8, line 12), "connectors" should read "connections".

Signed and sealed this 20th day of May 1975.

(SEAL)
Attest:

RUTH C. MASON
Attesting Officer

C. MARSHALL DANN
Commissioner of Patents and Trademarks